United States Patent
Rathweg

(10) Patent No.: US 8,771,421 B2
(45) Date of Patent: Jul. 8, 2014

(54) ENTRANCE AND EXIT ROLL SEAL CONFIGURATION FOR A VAPOR DEPOSITION SYSTEM

(75) Inventor: Christopher Rathweg, Louisville, CO (US)

(73) Assignee: First Solar, Inc., Tempe, AZ (US)

( * ) Notice: Subject to any disclaimer, the term of this patent is extended or adjusted under 35 U.S.C. 154(b) by 77 days.

(21) Appl. No.: 12/977,543

(22) Filed: Dec. 23, 2010

(65) Prior Publication Data

US 2012/0064658 A1  Mar. 15, 2012

(51) Int. Cl.
  *C23C 16/455* (2006.01)
  *C23C 16/458* (2006.01)
  *H01L 31/18* (2006.01)

(52) U.S. Cl.
  USPC ........... 118/726; 118/719; 118/729; 198/850; 257/E21.09; 414/939

(58) Field of Classification Search
  USPC ................ 156/345.51; 198/850; 257/E21.09; 414/939
  See application file for complete search history.

(56) References Cited

U.S. PATENT DOCUMENTS

| | | | |
|---|---|---|---|
| 2,384,500 A | 9/1945 | Stoll | |
| 3,057,792 A | 10/1962 | Fröhlich | |
| 3,667,626 A | 6/1972 | Torelli et al. | |
| 4,401,052 A | 8/1983 | Baron et al. | |
| 4,664,951 A | 5/1987 | Doehler | |
| 4,770,291 A | 9/1988 | Shaw | |
| 4,797,054 A | 1/1989 | Arii | |
| 4,999,079 A * | 3/1991 | Ash | 156/345.2 |
| 5,102,279 A | 4/1992 | Ezaki et al. | |
| 5,248,349 A | 9/1993 | Foote et al. | |
| 5,304,499 A | 4/1994 | Bonnet et al. | |
| 5,366,764 A | 11/1994 | Sunthankar | |
| 5,372,646 A | 12/1994 | Foote et al. | |
| 5,470,397 A | 11/1995 | Foote et al. | |
| 5,536,333 A | 7/1996 | Foote et al. | |
| 5,712,187 A | 1/1998 | Li et al. | |
| 5,772,715 A | 6/1998 | McMaster et al. | |
| 5,945,163 A | 8/1999 | Powell et al. | |
| 5,994,642 A | 11/1999 | Higuchi et al. | |
| 6,037,241 A | 3/2000 | Powell et al. | |

(Continued)

FOREIGN PATENT DOCUMENTS

EP  0853345 A1  7/1998

*Primary Examiner* — Karla Moore
*Assistant Examiner* — Nathan K Ford
(74) *Attorney, Agent, or Firm* — MacMillan, Sobanski & Todd, LLC

(57) ABSTRACT

An apparatus is provided for vapor deposition of a sublimated source material as a thin film on discrete photovoltaic (PV) module substrates conveyed in a continuous non-stop manner through said apparatus. The apparatus includes a vapor deposition head configured for receipt and sublimation of a source material, and for distributing the sublimated source material onto an upper surface of substrates conveyed through a deposition area. A roll seal configuration is provided at each of an entry slot and an exit slot for the substrates conveyed through the apparatus. The roll seal configuration further includes a cylinder rotatably supported at a defined gap height above a conveyance plane of the substrates such that the cylinder is not in continuous rolling contact with the substrates within the window of finished active semiconductor material. The cylinder is floatable in a vertical direction relative to the conveyance plane of the substrates such that the cylinder rolls up and over surface variations in the substrates that exceed the gap height as the substrates are conveyed under the cylinder.

12 Claims, 5 Drawing Sheets

(56) References Cited

U.S. PATENT DOCUMENTS

| | | | |
|---|---|---|---|
| 6,058,740 A * | 5/2000 | McMaster et al. | 65/60.1 |
| 6,080,240 A | 6/2000 | Uchida et al. | |
| 6,423,565 B1 | 7/2002 | Barth et al. | |
| 6,444,043 B1 | 9/2002 | Gegenwart et al. | |
| 6,719,848 B2 | 4/2004 | Faykosh et al. | |
| 7,194,197 B1 | 3/2007 | Wendt et al. | |
| 7,211,462 B2 | 5/2007 | Romeo et al. | |
| 7,220,321 B2 | 5/2007 | Barth et al. | |
| 2002/0117199 A1 | 8/2002 | Oswald | |
| 2003/0044539 A1 | 3/2003 | Oswald | |
| 2005/0158891 A1 * | 7/2005 | Barth et al. | 438/22 |
| 2007/0169630 A1 * | 7/2007 | Auyoung | 99/275 |
| 2008/0073559 A1 | 3/2008 | Horsky et al. | |
| 2009/0194165 A1 | 8/2009 | Murphy et al. | |

* cited by examiner

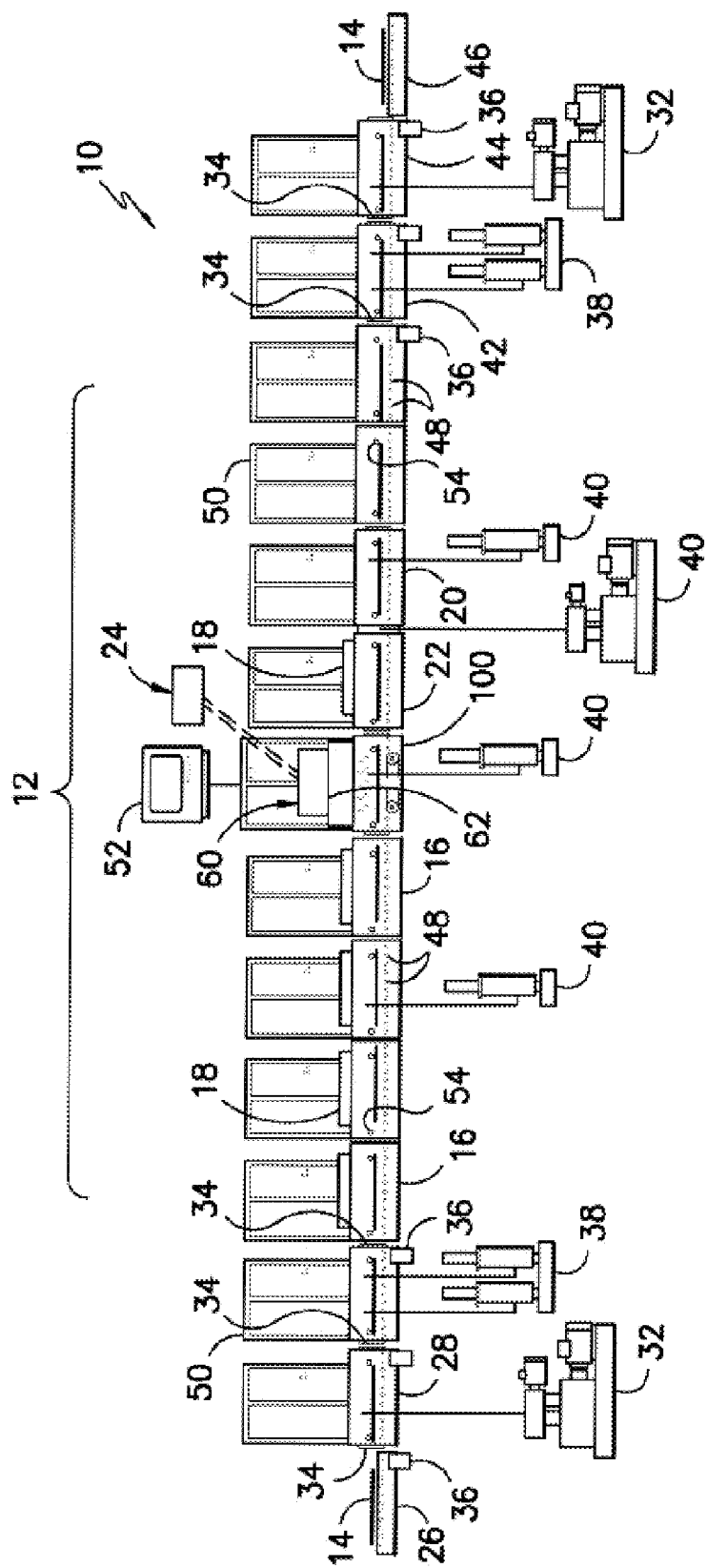
Fig. -1-

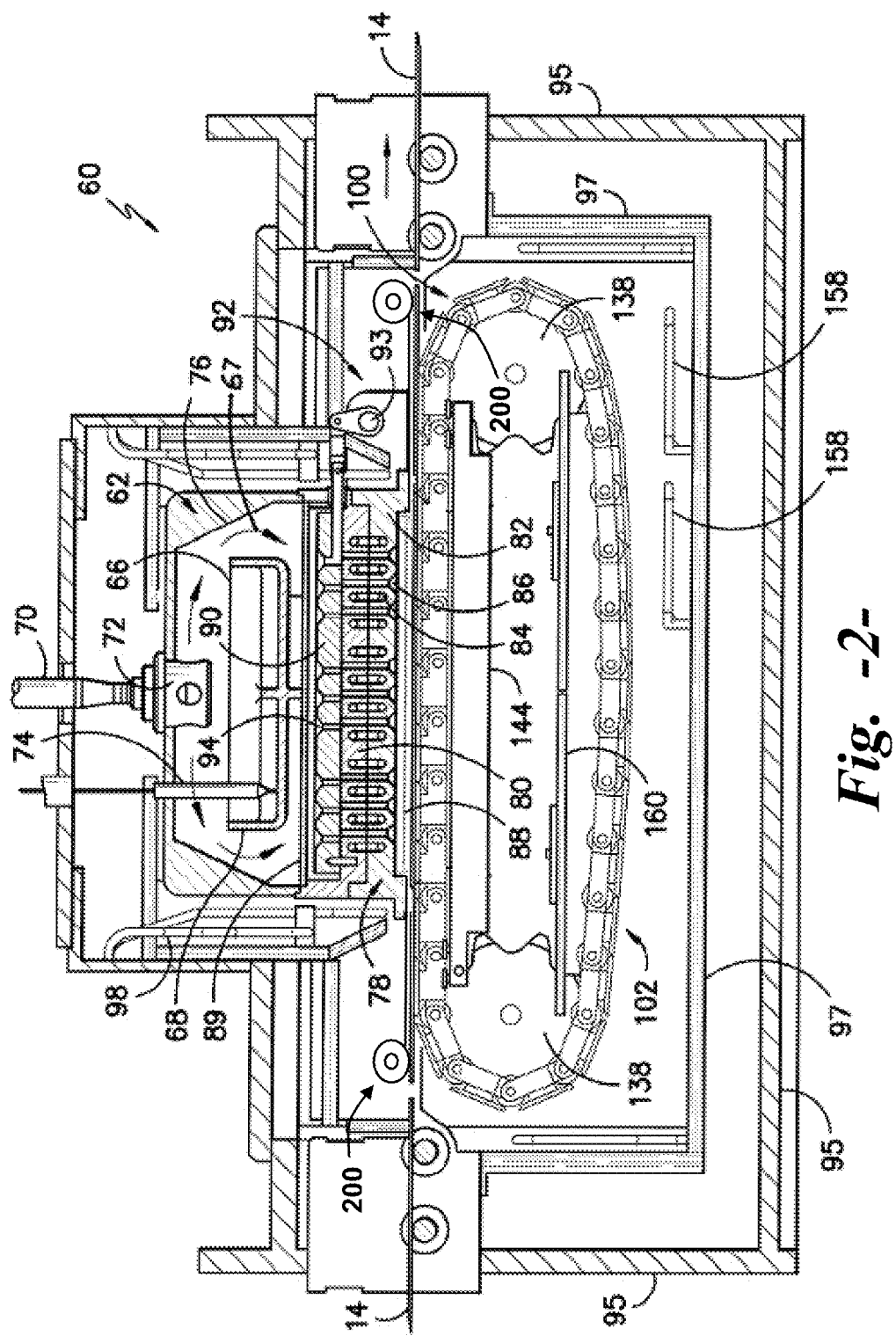
Fig. -2-

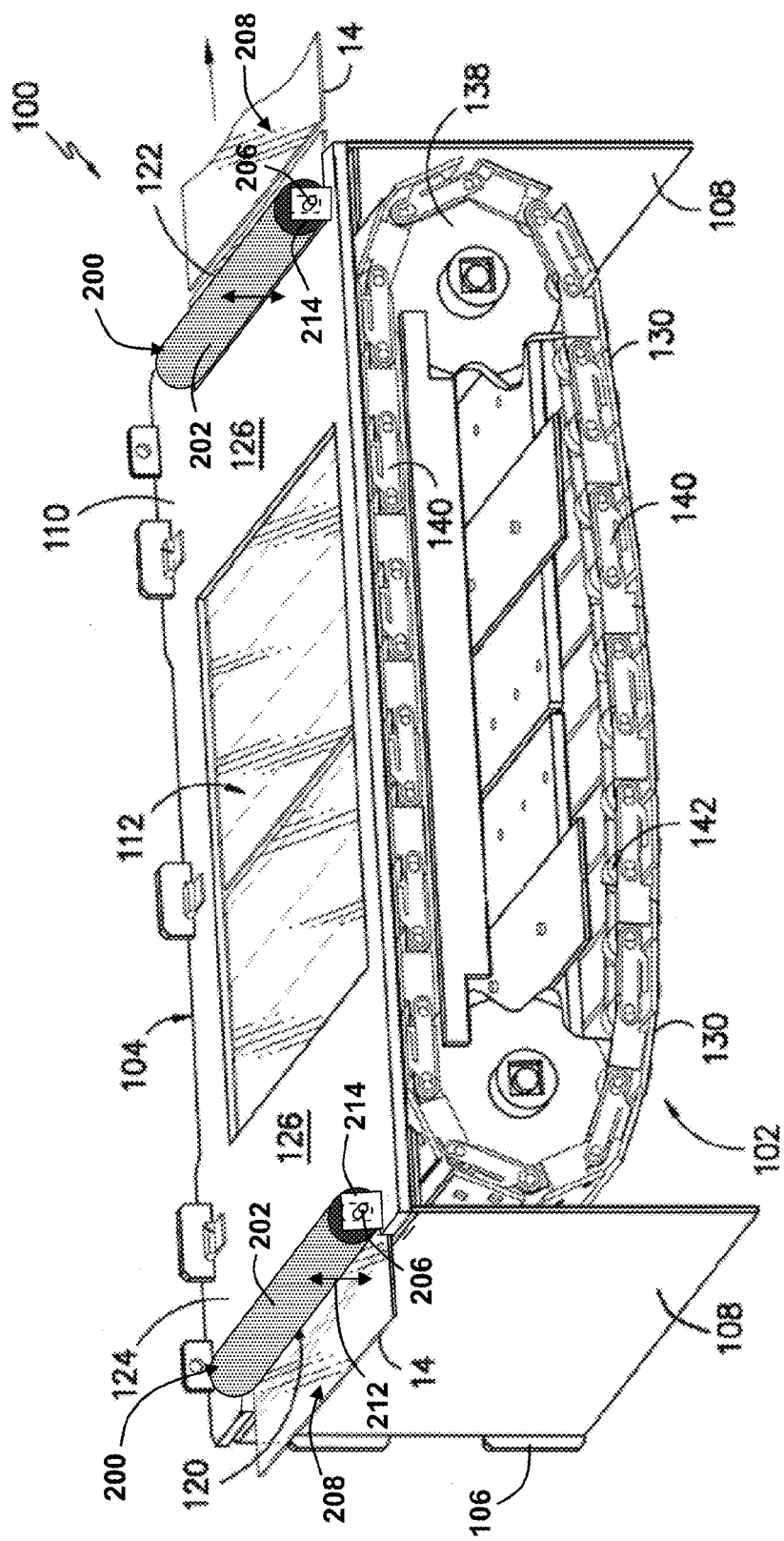
Fig. -3-

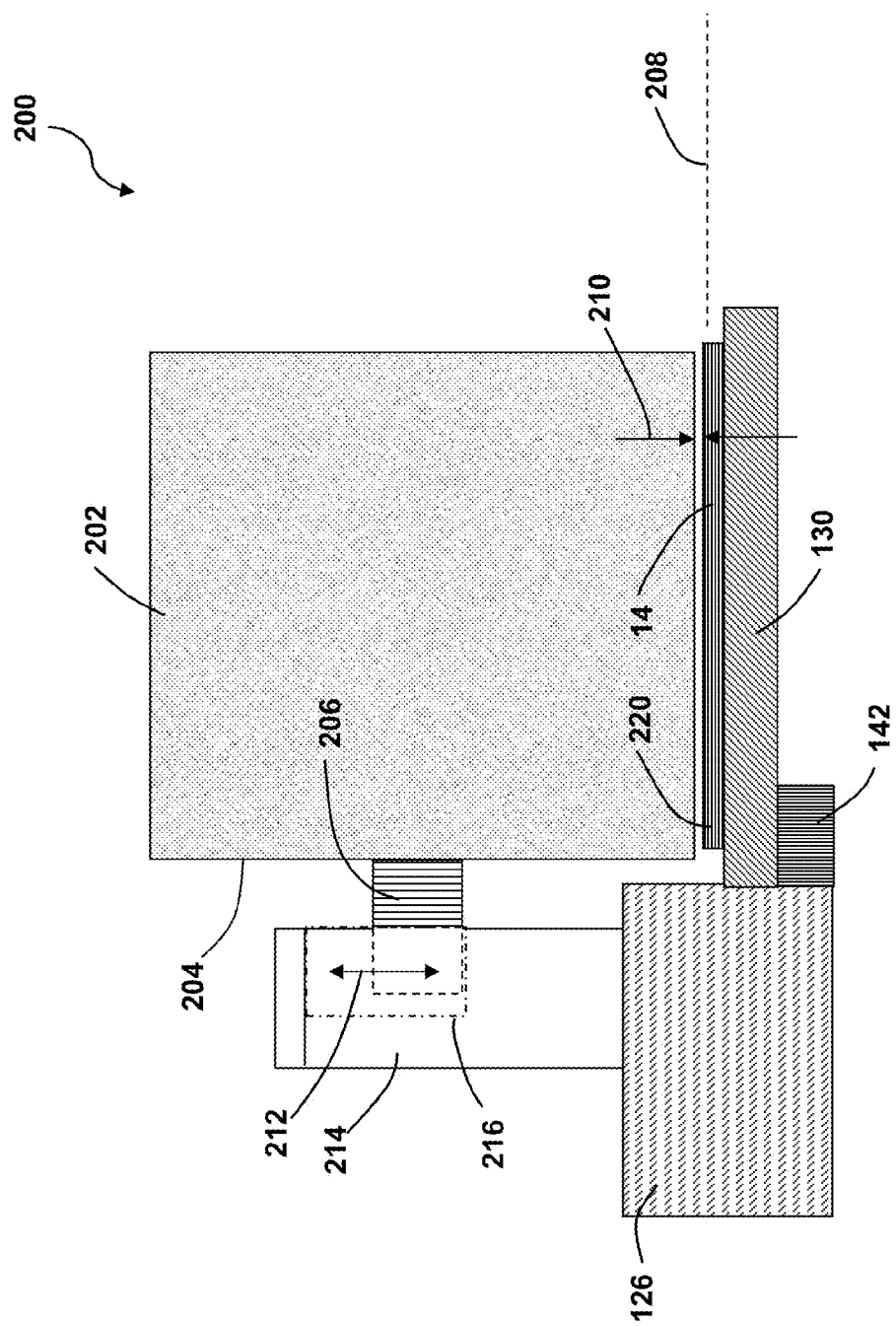
Fig. -4-

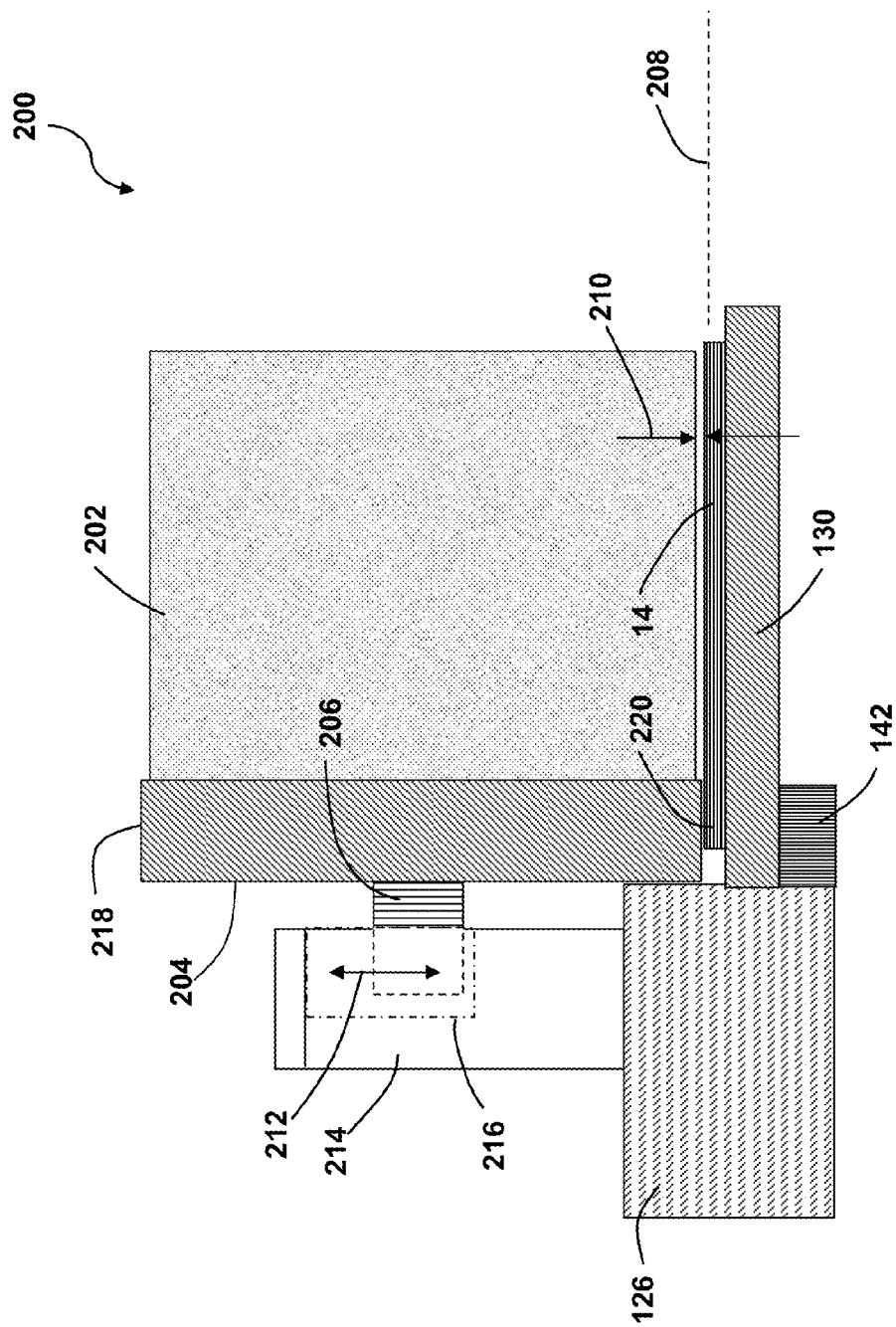
Fig. -5-

ENTRANCE AND EXIT ROLL SEAL CONFIGURATION FOR A VAPOR DEPOSITION SYSTEM

FIELD OF THE INVENTION

The subject matter disclosed herein relates generally to the field of thin film deposition systems wherein a thin film layer, such as a semiconductor material layer, is deposited on a substrate. More particularly, the disclosed subject matter is related to a system for depositing a thin film layer of a photo-reactive material on a glass substrate in the formation of photovoltaic (PV) modules.

BACKGROUND OF THE INVENTION

Thin film photovoltaic (PV) modules (also referred to as "solar panels" or "solar modules") are gaining wide acceptance and interest in the industry as a viable source of alternate energy, particularly modules based on cadmium telluride (CdTe) paired with cadmium sulfide (CdS) as the photo-reactive components. Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner. In this regard, the high cost of the photo-reactive source materials used in the production of conventional solar panels is a limiting factor, and maximizing the utilization of these materials is of primary importance.

In a continuous vapor deposition process, the individual glass sheets (substrates) are continuously conveyed through a deposition apparatus, as compared to a batch process wherein the substrates are indexed into and out of the deposition apparatus. The ingress (entrance) and egress (exit) seals through which the substrates enter and leave the deposition apparatus are, however, an inherent leakage source for the sublimated source material. Slit seals are typically provided having the smallest slit reasonably possible through which the substrates travel. However, variations in substrate thickness, size, flatness, and other dimensional anomalies, often results in the substrates rubbing against the slit seal members, resulting in scratches and other flaws in the film layer or even jamming of the substrates.

U.S. Pat. No. 5,772,715 describes a deposition system wherein multiple vacuum chamber slit seals are provided at the ingress and egress locations. These seals are relatively complicated and involve establishing three separate vacuum stages drawn by separate vacuum pumps. Although the U.S. '715 patent describes that the seals are suitable for processing either discrete glass sheets or a continuous glass ribbon, they are mechanically quite complex and would add significantly to the manufacturing costs of PV modules.

U.S. Pat. No. 6,058,740 describes a deposition system with upper and lower seal rolls provided at the ingress and egress seal locations. The rolls are driven and engage and roll against the substrates as they enter and exit the vacuum deposition chamber. This system, however, relies on frictional rolling engagement of the seal rolls against the surface of the thin film layer at the egress point, which may contribute to scratching, marring, or other induced flaws in the film layer.

Accordingly, there exists an ongoing need in the industry for a seal configuration that is particularly suited for large scale and efficient production of PV modules, particularly CdTe based modules, by continuous conveyance of a plurality of discrete substrates through a vapor deposition chamber.

BRIEF DESCRIPTION OF THE INVENTION

Aspects and advantages of the invention will be set forth in part in the following description, or may be obvious from the description, or may be learned through practice of the invention.

In accordance with an embodiment of the invention, an apparatus is provided for vapor deposition of a sublimated source material, such as CdTe, as a thin film on discrete photovoltaic (PV) module substrates that are conveyed in a continuous, non-stop manner through the apparatus. The apparatus includes a deposition head configured for receipt and sublimation of the source material. The deposition head distributes the source material onto an upper surface of the substrates conveyed through a deposition area within the apparatus. The substrates move into and out of the deposition area through entry and exit slots. At least one of the slots is defined by a transversely extending roll seal configuration. In a particular embodiment, the entry and exit slots include the roll seal configuration. The seal configuration includes a cylinder rotatably supported at a defined gap height above a conveyance plane of the substrates such that said cylinder is not in continuous rolling contact with the substrates in a defined finished window of active semiconductor material (the source material) of the PV module. The cylinder is floatable in a vertical direction relative to the conveyance plane of the substrates such that the cylinder rolls up and over surface variations in the substrates that exceed the gap height as the substrates are conveyed under the cylinder.

The cylinder may, in certain embodiments, be gravity-biased towards the conveyance plane of the substrates. In other embodiments, the cylinder may be spring-biased towards the conveyance plane of the substrates. The ends of the cylinder may be rotationally supported within respective bearing blocks.

In a unique embodiment, the cylinder has a stepped diameter with increased greater diameter bands at the ends thereof. The increased diameter bands are configured to roll continuously or intermittently on lateral edge portions of the substrates that are not conveyed through the deposition area. The lateral edge portions are not used as part of the active semiconductor area of the finished PV module.

In certain embodiments, the cylinder is freely rotatable and is thus only rotated when engaged by the underlying substrates. In other embodiments, the cylinder may be driven, for example at the conveyance speed of the substrates.

In still further embodiments, the apparatus may include a conveyor assembly configured below the vapor deposition head. This conveyor assembly may include a housing defining an enclosed interior volume with a conveyor operably disposed within the housing and driven in an endless loop path having an upper leg that moves in a conveyance direction and a lower leg that moves in an opposite return direction. The housing may further include a top member that defines the deposition area, with the deposition head configured on the top member such that substrates on the conveyor are exposed to the sublimated source material from the deposition head through the deposition area in the top member. The cylinders define the entrance and exit slots at opposite longitudinal ends of the top member. For example, the cylinders may be rotatably mounted in bearing blocks supported on the top member. The cylinders may be vertically adjustable in the bearing blocks to adjust the gap height.

The present invention also encompasses various method embodiments for providing a seal for at least one of an entry or an exit slot in a vapor deposition apparatus wherein a sublimated source material is deposited as a thin film on discrete photovoltaic (PV) module substrates conveyed in a continuous non-stop manner through the apparatus. The method includes disposing a rotatably supported cylinder at a defined gap height above a conveyance plane of the substrates such that the cylinder is not in continuous rolling contact with the substrates in the finished window of active semiconductor material of the PV module. The cylinder is supported to be floatable in a vertical direction relative to the conveyance plane of the substrates such that the cylinder rolls up and over surface variations in the substrates that exceed the gap height as the substrates are conveyed under the cylinder. In a particular embodiment, the method is employed at each of the entry and exit slots of the vapor deposition apparatus.

In an alternate embodiment, the lateral edge portions of the substrate are rotatably engaged intermittently or continuously by an increased diameter band on the ends of the cylinder such that the cylinder rotates with conveyance of the substrates. The cylinder may be driven at the conveyance speed of the substrates.

Variations and modifications to the apparatus and methods discussed above are within the scope and spirit of the invention and may be further described herein.

These and other features, aspects and advantages of the present invention will become better understood with reference to the following description and appended claims.

BRIEF DESCRIPTION OF THE DRAWING

A full and enabling disclosure of the present invention, including the best mode thereof, is set forth in the specification, which makes reference to the appended drawings, in which:

FIG. 1 is a plan view of an embodiment of a system incorporating a vapor deposition apparatus in accordance with aspects of the invention;

FIG. 2 is a cut-away side view of an embodiment of a vapor deposition in accordance with aspects of the invention;

FIG. 3 is perspective view of an embodiment of a conveyor assembly configured with a roll seal configuration in accordance with aspects of the invention;

FIG. 4 is an enlarged front view of an embodiment of a roll seal configuration; and, FIG. 5 is an enlarged front view of an alternative embodiment of a roll seal configuration.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIG. 1 illustrates an embodiment of a vapor deposition system 10 that may incorporate aspects of the invention. The system 10 is configured for deposition of a thin film layer on a photovoltaic (PV) module substrate 14 (referred to hereafter as "substrate"). The thin film may be, for example, a film layer of cadmium telluride (CdTe). Although the invention is not limited to any particular film thickness, as mentioned, it is generally recognized in the art that a "thin" film layer on a PV module substrate is generally less than about 10 microns (µm). It should be appreciated that the present apparatus and process are not limited to use in the system 10 illustrated in FIG. 1, but may be incorporated into any suitable processing line configured for vapor deposition of a thin film layer onto a PV module substrate 14.

For reference and an understanding of an environment in which the present apparatus may be used, the system 10 of FIG. 1 is briefly described below, followed by a detailed description of the unique features of the present apparatus.

Referring to FIG. 1, the exemplary system 10 includes a vacuum chamber 12 defined by a plurality of interconnected modules. Any combination of initial ("rough") and high ("fine") vacuum pumps 40 may be configured with the modules to draw and maintain a vacuum within the chamber 12. A plurality of interconnected heater modules 16 define a pre-heat section of the vacuum chamber 12 through which the substrates 14 are conveyed and heated to a desired temperature before being conveyed into a vapor deposition apparatus 60. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 within the vacuum chamber 12 downstream of the vapor deposition apparatus 60. The cool-down modules 20 define a cool-down section within the vacuum chamber 12 in which the substrates 14 having the thin film of sublimed source material deposited thereon are allowed to cool at a controlled cool-down rate prior to the substrates 14 being removed from the system 10. Each of the modules 20 may include a forced cooling system wherein a cooling medium, such as chilled water, refrigerant, or other medium is pumped through cooling coils configured with the modules 20.

In the illustrated embodiment of system 10, at least one post-heat module 22 is located immediately downstream of the vapor deposition apparatus 60 and before the cool-down modules 20. The post-heat module 22 maintains a controlled heating profile of the substrate 14 until the entire substrate is moved out of the vapor deposition apparatus 60 to prevent damage to the substrate, such as warping or breaking caused by uncontrolled or drastic thermal stresses.

As diagrammatically illustrated in FIG. 1, a feed device 24 is configured with the vapor deposition apparatus 60 to supply source material, such as granular CdTe. Preferably, the feed device 24 is configured so as to supply the source material without interrupting the continuous vapor deposition process within the apparatus 60 or conveyance of the substrates 14 through the apparatus 60.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "fine" (i.e., high) vacuum pump 38 is configured with the buffer module 30 to increase the vacuum in the buffer module 30 to essentially the vacuum within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 14 out of the vacuum chamber 12 in a step-wise fashion without loss of vacuum condition within the vacuum chamber 12.

The system 10 also includes a conveyor system configured to move the substrates 14 into, through, and out of the vacuum chamber 12. In the illustrated embodiment, this conveyor system includes a plurality of individually controlled conveyors 48, with each of the various modules including one of the conveyors 48. It should be appreciated that the type or configuration of the conveyors 48 in the various modules may vary. In the illustrated embodiment, the conveyors 48 are roller conveyors having driven rollers that are controlled so as to achieve a desired conveyance rate of the substrates 14 through the respective module and the system 10 overall. The conveyor in the vapor deposition apparatus 60 may have a different configuration, as discussed in greater detail below.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as illustrated in FIG. 1. The central system controller 52 can monitor and control (via the independent controllers 50) the functions of any one of the modules so as to achieve an overall desired heat-up rate, deposition rate, cool-down rate, and so forth, in processing of the substrates 14 through the system 10.

Referring to FIG. 1, for independent control of the individual respective conveyors 48, each of the modules may include any manner of active or passive sensor 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired constant conveyance rate through the vacuum chamber 12.

An exemplary vapor deposition apparatus 60 is depicted in FIG. 1 as a module. This module may take on various configurations and operating principles within the scope and spirit of the invention, and is generally configured for vapor deposition of a sublimated source material, such as CdTe, as a thin film on the PV module substrates 14. In the embodiment of FIG. 2, the vapor deposition apparatus 60 is a module that includes a casing 95 in which the internal components are contained, including a deposition head 62 mounted above a conveyor assembly 100. It should be appreciated that the casing 95 may include any manner of internal structure 97 that may support the conveyor assembly 100.

Various embodiments of a conveyor assembly 100 may be utilized. In FIG. 2, the conveyor assembly 100 may be modular in construction and include a housing 104, as depicted in FIG. 3. The housing 104 has been removed in the view of FIG. 2 for sake of clarity and explanation. Components of the conveyor assembly 100 are discussed below.

Referring to FIG. 2, the module 60 is depicted in greater detail. The vacuum deposition head 62 defines an interior space in which a receptacle 66 is configured for receipt of a granular source material (not shown). As mentioned, the granular source material may be supplied by a feed device or system 24 (FIG. 1) via a feed tube 70. The feed tube 70 is connected to a distributor 72 disposed in an opening in a top wall of the deposition head 62. The distributor 72 includes a plurality of discharge ports that are configured to evenly distribute the granular source material into the receptacle 66. A thermocouple 74 is operationally disposed through the top wall of the deposition head 62 to monitor temperature within the head chamber adjacent or in the receptacle 66. Sublimated source material will flow out of the receptacle 66 as leading and trailing curtains of vapor 67 over the transversely extending end walls 68, as indicated by the flow arrows in FIG. 2. Very little of the sublimated source material will flow over the side walls of the receptacle 66.

The supply of source material is considered "continuous" in that the vapor deposition process need not be stopped or halted in order to re-supply the apparatus 60 with source material. So long as the external supply is maintained, the feed system 24 will continuously supply batches or metered doses of the material into the vapor deposition apparatus 60.

A heated distribution manifold 78 is disposed below the receptacle 66, and may have a clam-shell configuration that includes an upper shell member 80 and a lower shell member 82. The mated shell members 80, 82 define cavities in which heater elements 84 are disposed. The heater elements 84 heat the distribution manifold 78 to a degree sufficient for indirectly heating the source material within the receptacle 66 to cause sublimation of the source material. The heat generated by the distribution manifold 78 also aids in preventing the sublimated source material from plating out onto components of the deposition head 62. Additional heater elements 98 may also be disposed within the deposition head 62 for this purpose. Desirably, the coolest component within the deposition head 62 is the upper surface of the substrates 14 conveyed therethrough so that the sublimated source material is ensured to plate primarily on the substrates.

As illustrated in FIG. 2, it may be desired to include a debris shield 89 between the receptacle 66 and the distribution manifold 78. This shield 89 serves to retain any granular or particulate source material from passing through and potentially interfering with operation of the other components of the deposition head 62.

The embodiment of FIG. 2 includes a movable shutter plate 90 disposed above the distribution manifold 78. This shutter plate 90 includes a plurality of passages 94 defined therethrough that align with the passages 86 in the distribution manifold 78 in a first operational position of the shutter plate 90 (not depicted in FIG. 2) such that the sublimated source material is free to flow through the shutter plate 90 and through the distribution manifold 78 for subsequent distribution through the plate 88. The shutter plate 90 is movable to a second operational position (depicted in FIG. 2) wherein the passages 94 are misaligned with the passages 86 in the distribution manifold 78. In this configuration, the sublimated source material is blocked from passing through the distribution manifold 78, and is essentially contained within the interior volume of the deposition head 62. Any suitable actuation mechanism 92 may be configured for moving the shutter plate 90 between the first and second operational positions. In the illustrated embodiment, the actuation mechanism 92 includes a rod 93 and any manner of suitable linkage that connects the rod 93 to the shutter plate 90. The rod 93 is externally rotated by any manner of mechanism located externally of the deposition head 62.

A distribution plate 88 is disposed below the manifold 78 at a defined distance above a horizontal plane of the upper surface of an underlying substrate 14, as depicted in FIG. 2. A deposition area 112 (FIG. 3) is thus defined by the space between the distribution plate 88 and the substrates 14. The distribution plate 88 includes a pattern of holes or passages therethrough that further distribute the sublimated source material passing through the distribution manifold 78 throughout the deposition area 112. The passages 86 in the distribution manifold 78 and the holes in the distribution plate 88 ensure a relatively uniform distribution of the sublimated source material in the transverse aspect of the vapor deposition apparatus 60. So long as the uniform transverse aspect of the vapor is maintained, a relatively uniform thin film layer is deposited onto the upper surface of the substrates 14.

The individual substrates 14 are conveyed through the vapor deposition module 60 at a controlled constant linear speed. In other words, the substrates 14 are not stopped or held within the module 60, but move continuously through the module at a controlled linear rate. The conveyance rate of the substrates 14 may be in the range of, for example, about 10 mm/sec to about 40 mm/sec. In a particular embodiment, this rate may be, for example, about 20 mm/sec. In this manner, the leading and trailing sections of the substrates 14 in the conveyance direction are exposed to the same vapor deposition conditions within the vapor deposition module 60. All regions of the top surface of the substrates 14 are exposed to the same vapor conditions so as to achieve a substantially uniform thickness of the thin film layer of sublimated source material on the upper surface of the substrates 14.

Referring to FIGS. 2 and 3, an entrance slot 120 and an exit slot 122 are defined at opposite longitudinal ends of the vapor deposition apparatus 60. The slots 120, 122 may define the longitudinal boundaries of the deposition area 112, or may be spaced from the boundaries of the deposition area 112, as discussed more fully below with respect to the embodiment of FIG. 3. Although it is within the scope and spirit of the invention that only one of the slots 120, 122 be configured as described herein, it is preferable if both slots are configured with the unique roll seal arrangement. In this regard, the entrance and exit slots 120, 122 are defined by transversely extending entrance and exit roll seal configurations 200, as described in greater detail below.

Referring to FIGS. 3 through 5, the roll seal configuration 200 includes a rotatably supported cylinder 202 with a longitudinal length so as to extend across the entry and exit slots 120, 122. In the illustrated embodiment, the cylinders 202 have axial ends 204 that are rotatably supported on a top member 110 of the conveyor housing 104 (described in greater detail below). For example, each axial end 204 may include a concentric post or axle 206 that is rotatably supported in a bearing block 214 mounted on the top member 110.

In the embodiments of FIGS. 4 and 5, the cylinder 202 has a defined gap height 210 above a conveyance plane 208 that coincides with the top surface of the substrate 14. This height is desirably within a range of 0.010 inch to about 0.125 inch, and may be, for example, about 0.010 inch. The defined gap height 210 ensues that the cylinder 202 remains out of contact with the substrate 14, yet provides an adequate seal to passage of the sublimated source material from the open deposition area 112.

As depicted by the arrows 212 in FIGS. 3 through 5, the cylinder 202 is floatable in the vertical direction relative to the conveyance plane 208. In this manner, variations in the substrate 14 that exceed the gap height 210 and result in contact with the cylinder 202 will cause the cylinder to roll and move vertically upwards as the thickness anomaly passes below the cylinder 202.

The cylinder 202 may be variously supported at its ends 204. In the illustrated embodiments, the post 206 floats within an elongated slot 216. The cylinder 202 may be gravity-biased in the slots 216 or, in an alternative embodiment, may be spring-biased towards the conveyance plane 208.

In a particular embodiment illustrated in FIG. 4, the cylinder 202 has a constant diameter between its axial ends 204 and is supported above the conveyance plane 208 of the substrates 14 by engagement of the post 206 within the slot 216. Thus, the gap height 210 is maintained by precise control of the dimension of the slot 216 and engagement of the post 206 within the slot 216. The post 206 is vertically floatable within the slot 216, as depicted by the arrow 212 in FIG. 4.

In an alternate embodiment illustrated in FIG. 5, the cylinder 202 has a stepped diameter with an increased diameter adjacent to the ends 204 defined by a band 218. This band 218 may be a component added onto the cylinder 202, such a sleeve formed of a material suitable for the deposition conditions within the apparatus 60. Alternatively, the band 218 may be machined directly into the surface of the cylinder 202. The increased diameter band 218 rides on a lateral edge portion 220 of the substrate 14 that lies outside of the defined window of finished active semiconductor material on the substrates 14. Thus, even if these lateral edge portions 220 receive a thin film deposition of the source material, contact of the edge portions 220 with the roller band 218 is not a concern. As can be appreciated from FIG. 5, the band positively rides on the substrate 14 along the lateral edges 220 and the increased diameter of the band 218 defines the gap height 210. This configuration provides for precise control of the gap height 210.

In the embodiment of FIG. 5, the cylinder 202 may be supported by the post 206 within the slot 216 so that the increased diameter bands 218 initially lie below the plane 208. Conveyance of the substrates 14 under the cylinder 202 causes the cylinder to thus roll up onto the lateral edge portions 220.

In still a further embodiment, the cylinder 202 in FIG. 5 may be supported within the slot 216 so that the increased diameter bands 218 lie above the conveyance plane 208. Thus, the bands will only contact and roll on the substrates 14 in the event of a warped or out of tolerance substrate 14.

With the embodiment of FIG. 4, it may be desired to drive the cylinder 202 at the conveyance speed of the substrates 14, or the cylinder 202 may freely rotate on the substrate 14.

Referring to FIGS. 2 and 3, the housing 104 of the conveyor assembly 100 defines an enclosed interior volume (at least around the sides and top) in which a conveyor 102 is contained. The conveyor 102 includes a plurality of slats 130 interconnected by link assemblies 140 and rollers 142. The conveyor 102 is driven in an endless loop within the housing 104 around sprockets 138, with this endless loop having an upper leg that moves along a track 144 in a conveyance direction of the substrates 14 through the vapor deposition head 62, and a lower leg that moves in an opposite return direction. The housing 104 includes a top member 110 that defines the deposition area 112. This open deposition area 112 aligns with the vapor deposition head 62, particularly the distribution plate 88, as seen in FIG. 2, such that the upper surface of the substrates 14 are exposed to the distribution plate 88 in the open deposition area 112.

Referring again to the housing construction 104 depicted in FIGS. 4 and 5, it can be seen that the open deposition area 112 in the top wall 110 has a transverse dimension (relative to the conveyance direction of the substrates 14) that is less than the transverse length of the underlying slats 130. In essence, the open deposition area 112 defines a "picture frame" around a completely flat, planar surface of the conveyor 102 in its upper leg of travel. This picture frame defines a greater surface area than the finished window of active semiconductor material. For example, the deposition area 112 may include the lateral edge portions of the substrates, even though such edge portions will not be a part of the active semiconductor window on the substrate.

Referring again to FIG. 3, the housing 104 includes end walls 108 and side walls 106. The end walls 108, side walls 106, and top wall 110 are connected to each other by a tab and slot arrangement such that the components of the housing 104 simply slide together and are pinned in position relative to each other. Assembly/disassembly of the housing 104 for maintenance or other procedures is a relatively easy process in this regard. The housing 104, and conveyor 102 contained therein are configured for drop-in placement of the assembly 110 in the vapor deposition module 60.

Still referring to FIGS. 2 and 3, the top wall member 110 cooperates with the vapor deposition head 62 to define the deposition area 112 and provide additional sealing. For example, the vapor deposition head (e.g., the lower shell member 82) may engage directly against sealing surfaces 126 defined by the top wall 110. This sealing arrangement ensures that the sublimated source material that passes through the distribution plate 88 is maintained in the open deposition area 112 of the top member 110 and does not escape at the interface of the conveyor assembly 100 and vapor deposition head 62.

Referring again to FIG. 2, the conveyor assembly 100 may include any manner of additional functional components within the housing 104. For example, any number or configuration of heater elements 158 may be configured within the housing 104, or between the housing 104 and the casing 95. Any configuration of thermal shields 160 may also be contained within the housing 104.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An apparatus for vapor deposition of a sublimated source material as a thin film on discrete photovoltaic (PV) module substrates conveyed in a continuous non-stop manner through said apparatus, comprising:
    a vapor deposition head configured for receipt and sublimation of a source material, and for distributing the sublimated source material onto an upper surface of substrates conveyed through a deposition area of said apparatus;
    a roll seal configuration with at least one of an entry slot and an exit slot for the substrates conveyed through said apparatus;
    said roll seal configuration further comprising a cylinder rotatably supported at a defined gap height above a conveyance plane of the substrates such that said cylinder is not in continuous rolling contact with the substrates in a defined active semiconductor area of the substrate;
    said cylinder floatable in a vertical direction relative to the conveyance plane of the substrates such that said cylinder rolls up and over surface variations in the substrates that exceed said gap height as the substrates are conveyed under said cylinder;
    said cylinder comprising a stepped diameter with increased greater diameter bands at ends thereof, said increased diameter bands configured to roll continuously or intermittently on lateral edge portions of the substrates.

2. The apparatus as in claim 1, wherein said cylinder is gravity-biased towards the conveyance plane of the substrates.

3. The apparatus as in claim 1, wherein said cylinder is spring-biased towards the conveyance plane of the substrates.

4. The apparatus as in claim 1, wherein said increased diameter bands are disposed initially below the conveyance plane of the substrates and roll up and onto the lateral edge portions of the substrates upon conveyance of the substrates below said cylinder.

5. The apparatus as in claim 4, wherein said cylinder is driven at a conveyance speed of the substrates.

6. The apparatus as in claim 1, wherein said gap height of said cylinder above the conveyance plane is within a range of about 0.010 inch to about 0.125 inch.

7. The apparatus as in claim 1, further comprising bearing blocks at ends of said cylinder, said cylinder freely rotatable in said bearing blocks.

8. The apparatus as in claim 1, further comprising a conveyor assembly configured below said vapor deposition head, said conveyor assembly further comprising:
    a housing defining an enclosed interior volume;
    a conveyor operably disposed within said housing to be driven in an endless loop path within said housing, said endless loop path having an upper leg that moves in a conveyance direction, and a lower leg that moves in an opposite return direction;
    said housing further comprising a top member defining said deposition area, said deposition head configured on said top member such that substrates on said conveyor are exposed to said deposition head through said deposition area in said top member;
    said cylinder defining said exit slot at a longitudinal end of said top member.

9. The apparatus as in claim 8, wherein said conveyor comprises a plurality of interconnected slats that support said substrates conveyed through said apparatus.

10. The apparatus as in claim 8, further comprising an additional said roll seal configuration at said entry slot with a cylinder at an opposite longitudinal end of said top member.

11. The apparatus as in claim 10, wherein said cylinders are rotatably mounted in bearing blocks supported on said top member.

12. The apparatus as in claim 10, wherein said cylinders are vertically adjustable in said bearing blocks to adjust said gap height.

* * * * *